United States Patent
Li et al.

(10) Patent No.: US 11,386,972 B2
(45) Date of Patent: Jul. 12, 2022

(54) DETERMINING READ VOLTAGES FOR MEMORY SYSTEMS WITH MACHINE LEARNING

(71) Applicant: Macronix International Co., Ltd., Hsinchu (TW)

(72) Inventors: Yung-Chun Li, New Taipei (TW); Yu-Ming Huang, Taipei (TW); Chih-Huai Shih, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 60 days.

(21) Appl. No.: 17/073,800

(22) Filed: Oct. 19, 2020

(65) Prior Publication Data

US 2021/0241845 A1 Aug. 5, 2021

Related U.S. Application Data

(60) Provisional application No. 62/967,607, filed on Jan. 30, 2020.

(51) Int. Cl.
*G11C 29/00* (2006.01)
*G11C 29/42* (2006.01)
(Continued)

(52) U.S. Cl.
CPC .......... *G11C 29/42* (2013.01); *G06F 11/1068* (2013.01); *G06N 20/00* (2019.01)

(58) Field of Classification Search
None
See application file for complete search history.

(56) References Cited

U.S. PATENT DOCUMENTS 10,861,562 B1 * 12/2020 Xiong .................. G06N 3/08
2012/0084490 A1 * 4/2012 Choi ..................... G11C 29/42
711/E12.008
(Continued)

FOREIGN PATENT DOCUMENTS

TW 1657456 4/2019

OTHER PUBLICATIONS

L. Zuolo, C. Zambelli, R. Micheloni and P. Olivo, "Solid-State Drives: Memory Driven Design Methodologies for Optimal Performance," in Proceedings of the IEEE, vol. 105, No. 9, pp. 1589-1608, Sep. 2017, doi: 10.1109/JPROC.2017.2733621. (Year: 2017).*

(Continued)

*Primary Examiner* — Daniel F. McMahon
(74) *Attorney, Agent, or Firm* — Fish & Richardson P.C.

(57) ABSTRACT

Systems, methods, and apparatus including computer-readable mediums for determining read voltages for memory systems with machine learning (ML) are provided. In one aspect, a memory system includes a memory and a memory controller configured to: obtain a first reading output of memory data using a first read voltage corresponding to a first set of parameters associated with the memory data; if the first reading output fails to pass an Error Correction Code (ECC) test, obtain a second reading output of the memory data using a second read voltage corresponding to a second set of parameters associated with the memory data and including the first set of parameters, the second read voltage being generated using at least one ML algorithm based on the second set of parameters; and if the second reading output passes the ECC test, output the second reading output as a target reading output of the memory data.

20 Claims, 7 Drawing Sheets

(51) Int. Cl.
*G06N 20/00* (2019.01)
*G06F 11/10* (2006.01)

(56) References Cited

U.S. PATENT DOCUMENTS

| | | | | |
|---|---|---|---|---|
| 2015/0085573 | A1* | 3/2015 | Sharon | G06F 11/004 |
| | | | | 365/185.03 |
| 2016/0132256 | A1* | 5/2016 | Jung | G06F 12/00 |
| | | | | 711/103 |
| 2017/0148510 | A1* | 5/2017 | Bazarsky | G11C 11/5642 |
| 2017/0271031 | A1* | 9/2017 | Sharon | G06F 11/3058 |
| 2018/0159560 | A1 | 6/2018 | Sharon et al. | |
| 2019/0347573 | A1 | 11/2019 | Shih | |
| 2020/0027503 | A1 | 1/2020 | Chen et al. | |
| 2020/0210096 | A1* | 7/2020 | Kim | G11C 16/3418 |
| 2020/0227132 | A1* | 7/2020 | Arai | G11C 29/52 |
| 2021/0118518 | A1* | 4/2021 | Wu | G11C 11/5671 |
| 2021/0193246 | A1* | 6/2021 | Jo | G11C 29/12005 |
| 2021/0224151 | A1* | 7/2021 | Lee | H03M 13/1111 |

OTHER PUBLICATIONS

Taiwan Office Action issued in TW Application No. TW 110101318 dated Apr. 6, 2022, including Machine translation, 24 pages.

* cited by examiner

DETERMINING READ VOLTAGES FOR MEMORY SYSTEMS WITH MACHINE LEARNING

CROSS-REFERENCE TO RELATED APPLICATION

This application claims priority under 35 USC § 119(e) to U.S. Provisional Patent Application Ser. No. 62/967,607, filed on Jan. 30, 2020, the entire content of which is hereby incorporated by reference.

BACKGROUND

Once memory cells in a data storage device, e.g., a memory system, are programmed, data can be read from the memory cells by sensing a programmed state of each memory cell by comparing a cell threshold voltage to one or more read voltages. However, the cell threshold voltage may change due to one or more factors, such as read disturbance or data retention, which may make the sensed programming states different from the written programmed states and cause failed bits in a reading output of the data.

SUMMARY

The present disclosure describes systems and techniques for determining read voltages for memory systems, e.g., non-volatile memory (NVM) systems, with machine learning (ML), which can reduce fail bit counts (FBCs) in reading outputs of memory data.

One aspect of the present disclosure features a memory system including a memory and a memory controller coupled to the memory and configured to: obtain a first reading output of target memory data in the memory by using a first read voltage corresponding to a first set of parameters associated with the target memory data; in response to determining that the first reading output fails to pass an Error-Correcting Code (ECC) test, obtain a second reading output of the target memory data by using a second read voltage corresponding to a second set of parameters associated with the target memory data, the second read voltage being generated using at least one machine learning (ML) algorithm based on the second set of parameters, the second set of parameters including the first set of parameters; and in response to determining that the second reading output passes the ECC test, output the second reading output as a target reading output of the target memory data.

In some embodiments, the memory controller is configured to generate the first read voltage using stored read voltage data based on the first set of parameters. The stored read voltage data can be stored in the memory.

In some embodiments, the stored read voltage data is generated based on supervised ML training using a plurality of inputs associated with the memory and corresponding optimal read voltages, each of the optimal read voltages corresponding to a minimum failed bit count of a reading output for a respective page in the memory with a respective input of the inputs, each of the inputs including respective values of a plurality of parameters, the plurality of parameters including the first set of parameters.

In some embodiments, each of the plurality of parameters has a respective influence level on a memory cell characteristic of the memory, and value intervals of the plurality of parameters in the inputs are determined based on the respective influence levels of the plurality of parameters. The supervised ML training can be performed during manufacturing the memory system.

In some embodiments, the stored read voltage data includes a transfer function generated based on the supervised ML training, the transfer function representing a relationship between an input of the plurality of parameters and an optimal read voltage. The transfer function can include a lookup table, a hash function, or a k mean.

In some embodiments, the memory controller is configured to update the stored read voltage data with the second read voltage in response to determining that the second reading output passes the ECC test. The memory controller can be configured to: update the stored read voltage data in response to determining that threshold voltages of states of memory cells in the target memory data are within corresponding predetermined ranges.

In some embodiments, the memory controller is configured not to update the stored read voltage data with the second read voltage in response to determining that the second reading output passes the ECC test and that at least one threshold voltage of a state of memory cells in the target memory data is outside of a corresponding predetermined range.

In some embodiments, the memory controller is configured to: in response to determining that the second reading output fails to pass the ECC test, adjust the second set of parameters and generate a new second read voltage using the at least one ML algorithm based on the adjusted second set of parameters. The memory controller can be configured to adjust the second set of parameters by adding one or more new parameters associated with the target memory data.

In some embodiments, the memory controller is configured to: determine whether the first reading output passes the ECC test by determining whether a failed bit count (FBC) of the first reading output is beyond a first predetermined threshold.

In some embodiments, the memory controller is configured to: in response to determining that the failed bit count of the first reading output is no more than the first predetermined threshold, determine whether the failed bit count of the first reading output is beyond a second predetermined threshold that is smaller than the first predetermined threshold.

In some embodiments, the memory controller is configured to: in response to determining that the failed bit count of the first reading output is no more than the second predetermined threshold, output the first reading output as the target reading output of the target memory data.

In some embodiments, the memory controller is configured to: in response to determining that the failed bit count of the first reading output is beyond the second predetermined threshold and no more than the first predetermined threshold, generate a third read voltage using the at least one ML algorithm. The memory controller can be configured to update the stored read voltage data with the third read voltage. In some embodiments, the memory controller is configured to: update the stored read voltage data with the third read voltage in response to determining that threshold voltages of states of memory cells in the target memory data are within corresponding predetermined ranges.

In some embodiments, the first set of parameters includes at least one of address information, a number of P/E cycles, a reading temperature, a read disturbance level, or a retention time.

In some embodiments, the second set of parameters includes at least one of a failed bit count in the first reading output, a number of "1" values obtained for each read voltage, a number change of "1" values between a previous read voltage and a current read voltage, a read time, a syndrome of low-density parity-check (LDPC) code, or a number of iteration of LDPC code.

In some embodiments, the at least one ML algorithm includes at least one of a linear regression, a support vector regression, or a deep learning algorithm including a convolutional neural network (CNN) algorithm or a Recurrent Neural Network (RNN) algorithm.

In some embodiments, the memory controller is configured to: in response to determining that the first reading output passes the ECC test, output the first reading output as the target reading output of the target memory data.

In some embodiments, the memory controller is configured to: receive a read quest from a host device, the read request including information of the target memory data; and output the target reading output of the target memory data to the host device.

Another aspect of the present disclosure features a memory system including a memory and a memory controller coupled to the memory and configured to: determine a first read voltage using stored read voltage data based on a first set of parameters associated with memory data to be read from the memory; obtain a first reading output by reading the memory data using the first read voltage; determine whether the first reading output passes an Error Correction Code (ECC) test; in response to determining that the first reading output fails to pass the ECC test, generate a second read voltage using at least one machine learning (ML) algorithm based on a second set of parameters associated with the memory data, the second set of parameters including the first set of parameters and at least one additional parameter; obtain a second reading output by reading the memory data using the second read voltage; determine whether the second reading output passes the ECC test; and in response to determining that the second reading output passes the ECC test, output the second reading output as the memory data read from the memory.

In some embodiments, the memory controller is configured to: in response to determining that the second reading output passes the ECC test, update the stored read voltage data with the second read voltage.

A further aspect of the present disclosure features a memory controller coupled to a memory, the memory controller including: at least one processor; an Error Correction Code (ECC) circuit; a machine learning (ML) circuit; and at least non-transitory medium storing instructions executable by the processor. The memory controller is configured to: determine, by the ML circuit, a first read voltage using stored read voltage data based on a first set of parameters associated with memory data to be read from the memory; obtain, by the processor, a first reading output by reading the memory data using the first read voltage; determine, by the ECC circuit, whether the first reading output passes an ECC test; in response to determining that the first reading output does not pass the ECC test, generate, by the ML circuit, a second read voltage using at least one machine learning (ML) algorithm based on a second set of parameters associated with the memory data, the second set of parameters including the first set of parameters and at least one additional parameter; obtain, by the processor, a second reading output by reading the memory data using the second read voltage; determine, by the ECC circuit, whether the second reading output passes the ECC test; and in response to determining that the second reading output passes the ECC test, output, by the processor, the second reading output as the memory data read from the memory.

In some embodiments, the stored read voltage data is stored in the memory, and the memory controller includes a memory interface, and the ML circuit is configured to communicate with the memory through the memory interface.

In some embodiments, the memory controller includes an open NAND flash interface (ONFI) or a toggle interface.

Implementations of the above techniques include methods, systems, computer program products and computer-readable media. In one example, a method can be performed by a memory controller coupled to a non-volatile memory and the method can include the above-described actions performed by the memory controller, e.g., the actions for determining read voltages for the non-volatile memory with machine learning. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

DETAILED DESCRIPTION

Figure 1A:
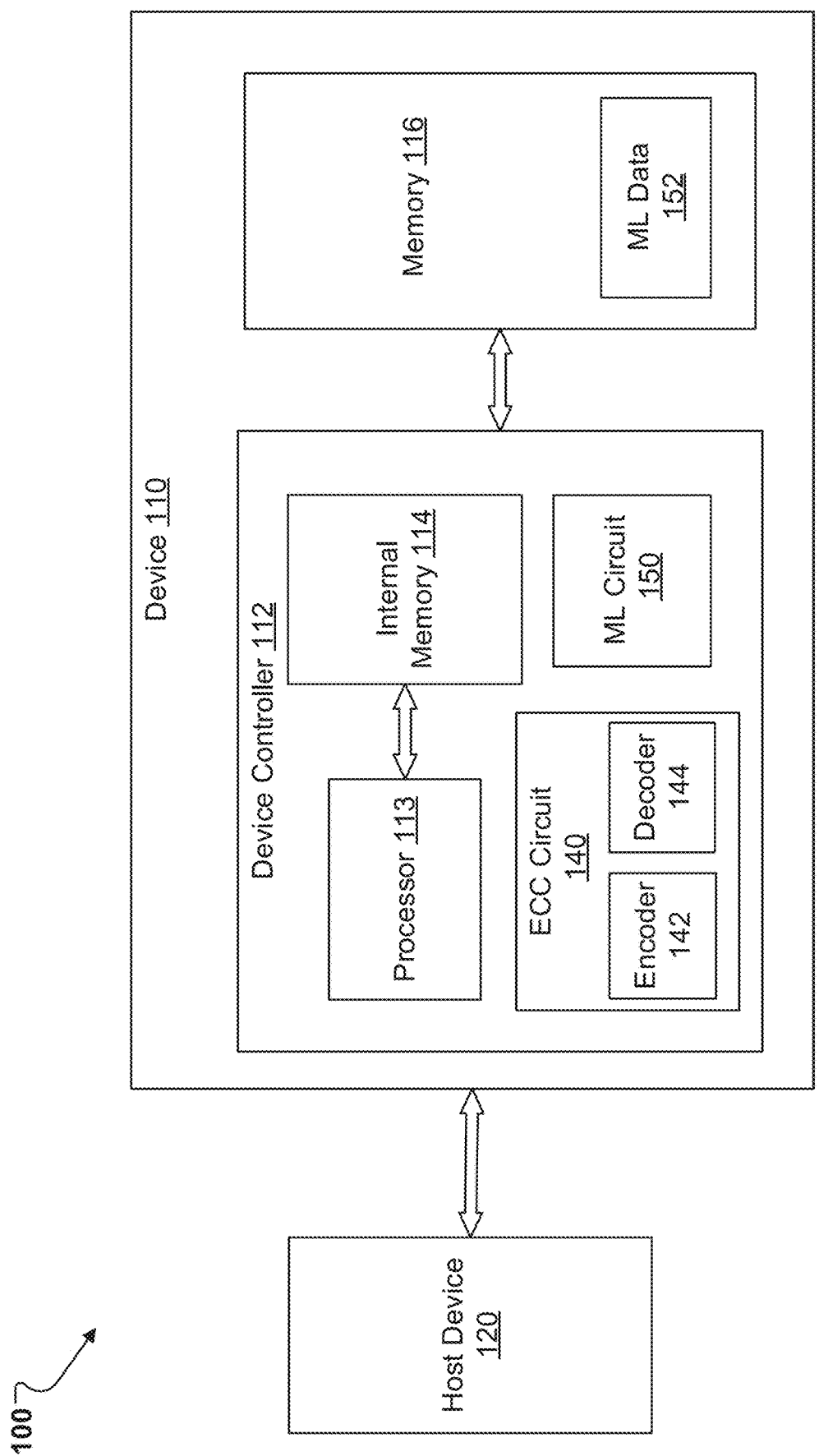
FIG. 1A illustrates an example of a system, according to one or more implementations.

Due to frequent read operations, data stored in a memory may suffer from read disturbance, in which states of memory cells, e.g., an erased state and one or more programmed states, in the memory may have increased threshold voltages. The read disturbance may cause failed bits (or error bits) in reading outputs of the data. An error-correcting code (ECC) decoder can be configured to decode the data read from the memory to detect and correct, up to an error correction capability of an ECC scheme, any bit errors that may be present in the data.

The data can be read from memory cells by sensing a state of each memory cell by comparing a cell threshold voltage to a read voltage (or a reference read voltage). The read voltage can be optimized, e.g., by linear searching, to be an optimal read voltage (or an optimized read voltage), such that a failed bit count (or a number of failed bits) in the reading output of the data is minimum (or fewest). The optimal read voltage can depend on a number of parameters, e.g., a program/erase (P/E) cycle count, a word line (WL) address or page address, layer by layer variation, and temperature. Determining the optimal read voltage can be time-consuming and tedious, and the computing time and power consumption can increase as the number of input parameters considered in the determining process. Therefore, it would be desirable to develop techniques that can read accurately with a limited read latency over a time-variant channel and can reduce ECC decoding overhead via optimal read voltages.

In some cases, a same verified read voltage is used for reading data from a memory, no matter how input parameters change. However, the verified read voltage can be far from an optimal read voltage, leading to an additional overhead for ECC decoding. In some cases, a lookup table storing multiple verified read voltages is used. The verified read voltages are in a static order according to corresponding priority levels that are independent to input parameters. Data is first read with a first priority verified voltage; if a reading output of the data fails to pass an ECC test, a second priority verified voltage is then used. The retry read process continues until the reading output passes the ECC test. In some cases, data is first read with a read voltage determined based on input parameters. If the reading output fails to pass the ECC test, a retry read process is performed with a lookup table storing a static order of read voltages that are independent to the input parameters. However, the lookup table construction can cost a great amount of human resources and developing time. Engineers may have to fine tune optimal read voltages case by case based on the input parameters. The table size can become larger and larger with different process technologies and different operating conditions.

Machine learning (ML) technology can be used to determine optimal read voltages. In some cases, offline inference by machine learning can determine a relationship between input parameters and optimal read voltages, which can be recorded in a lookup table. However, the offline inference can cause a huge memory overhead to achieve high accuracy. In some cases, online inference by machine learning can compute an optimal read voltage whenever there is a read request. However, the online inference can require additional computing and time overheads to degrade the read latency.

Implementations of the present disclosure provide systems, methods, and techniques for determining read voltages, e.g., optimal read voltages, for memory systems, e.g., non-volatile memory (NVM) systems, with machine learning. The techniques can optimize read voltages by machine learning algorithms, reduce ECC decoding overhead, reduce average on-line inference time of machine learning algorithms, reduce extra memory overhead, reduce read latency, reduce developing costs, and improve read accuracy. The techniques can also enable an error-handling flow that allows adjusting read voltages and then performing ECC decoding multiple times to improve reliability of the memory systems.

In some implementations, the determination of read voltages can include a coarse phase and optionally a fine phase. A transfer function can be created by supervised ML offline training. The transfer function can include a lookup table having a size smaller than a normal lookup table, e.g., by grouping-based offline training. The transfer function can also include a hash function, k mean, or any other suitable form. The transfer function can be stored in a memory. In the coarse phase, the transfer function is used to determine a first read voltage based on a first set of input parameters associated with memory data to be read from the memory. If a first reading output of the memory data passes an ECC test, the first reading output is output as a target reading output of the memory data. If the first reading output of the memory data fails to pass the ECC test, the fine phase is triggered. In the fine phase, a second set of input parameters associated with the memory data is collected. The second set of input parameters includes the first set of input parameters and one or more additional parameters. An ML-based online training and inference can be performed based on the second set of input parameters to generate a second read voltage. The ML algorithms can include linear regression, support vector regression, CNN, RNN, or other suitable algorithms. If a second reading output of the memory data using the second read voltage passes the ECC test, the second reading output is output as the target reading output of the memory data. A result of the ECC phase, e.g., the second read voltage and associated information, can be provided to calibrate or update the transfer function. That is, the content of the transfer function can be dynamically updated.

For most read requests, read voltages determined in the coarse phase can enable successful reading outputs. The fine phase is triggered not for each read request, but only when the coarse phase fails. Moreover, as the triggered range of the fine phase is small, the power and time consumption of the fine phase can be trivial for the memory systems. Thus, the techniques can enable accurate reading with reduced read latency, reduced on-line inference time, and reduced computation and memory overheads.

In some implementations, supervised ML offline training can be executed after a memory is fabricated. The supervised ML offline training can use a number of inputs associated with the memory and corresponding optimal read voltages. Each of the optimal read voltages can correspond to a minimum failed bit count of a reading output for a respective page in the memory with a respective input of the inputs. Each of the inputs can include respective values of a plurality of input parameters. According to the memory cell characteristics, the input parameters can have different influence levels. For a parameter with a higher influence level, training data can be collected with a smaller interval; for a parameter with a lower influence level, training data can be collected with a larger interval. In such a way, collection time and a volume of the training data can be reduced. A result of the supervised ML offline training, e.g., a transfer function such as a lookup table, can be stored in the memory. A memory controller can include a machine learning (ML) circuit configured to perform the coarse phase and the fine phase for online inference in response to read requests.

The techniques can be applied to various types of volatile memory devices or non-volatile memory devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to two-dimensional (2D) memory devices or three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

FIG. 1A illustrates an example of a system 100 that includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

In some implementations, the device controller 112 includes an ECC circuit 140. The ECC circuit 140 can include an encoder 142 and a decoder 144. The ECC encoder 142 can be configured to receive data to be stored to the memory 116 and to generate a codeword, e.g., by encoding the data using an ECC encoding scheme. The ECC encoder 142 can include a Reed Solomon encoder, a Bose-Chaudhuri-Hocquenghem (BCH) encoder, a low-density parity check (LDPC) encoder, a Turbo Code encoder, or any combination thereof. The ECC decoder 144 can be configured to decode data read from the memory 116 to detect and correct, up to an error correction capability of the ECC scheme, any bit errors that may be present in the data.

As discussed with further details below, the device controller 112 is configured to determine read voltages (e.g., optimal read voltages) for reading data from the memory 116, e.g., in response to read requests from the host device 120. The device controller 112 can include an ML circuit 150 configured to determine the read voltages through a coarse phase and an optional fine phase. A supervised ML offline training can be pre-executed on the memory 116, e.g., during manufacturing the device 110, to determine a relationship between input parameters associated with the memory 116 and optimal read voltages. A result of the supervised ML training, e.g., a transfer function, can be stored as ML data 152 in the memory 116. In some implementations, the ML data 152 can be also stored in the device controller 112, e.g., in the ML circuit 150 or in the internal memory 114.

In response to a read request from the host device 120, the ML circuit 150 can determine a first read voltage using the transfer function in the ML data 152 based on a first set of input parameters. If a first reading output of memory data using the first read voltage passes an ECC test, the first reading output is output, e.g., by the device 110 to the host device, as a target reading output of the memory data. If the first reading output of the memory data fails to pass the ECC test, the ML circuit 150 is configured to perform the fine phase. In the fine phase, a second set of input parameters associated with the memory data is collected. The second set of input parameters can include the first set of input parameters and one or more additional parameters. The ML circuit 150 can use one or more ML algorithms to determine a second read voltage based on the second set of input parameters. The ML algorithms can include linear regression, support vector regression, CNN, RNN, or other suitable algorithms. If a second reading output of the memory data using the second read voltage fails to pass the ECC test, the ML circuit 150 can adjust the second set of input parameters, e.g., by adding one or more new parameters, and generate a new second read voltage. If the second reading output of the memory data using the second read voltage passes the ECC test, the second reading output is output as the target reading output of the memory data. A result of the ECC phase, e.g., the second read voltage and associated information, can be used to calibrate or update the ML data 152. That is, the content of the ML data 152 can be dynamically updated.

Figure 1B:
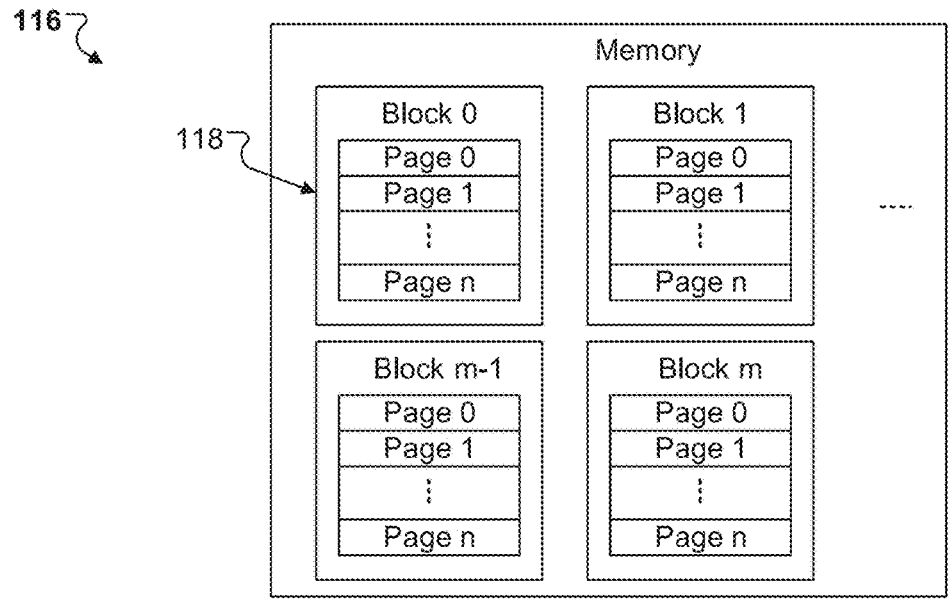
FIG. 1B illustrates an example memory, according to one or more implementations.

FIG. 1B illustrates an example configuration of the memory 116 that includes a plurality of physical blocks 118, e.g., Block 0, Block 1, . . . , Block m-1, and Block m. Each block can include a same number of pages, e.g., Page 0, Page 1, . . . , Page n. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together.

In some implementations, the memory 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

Figure 1C:
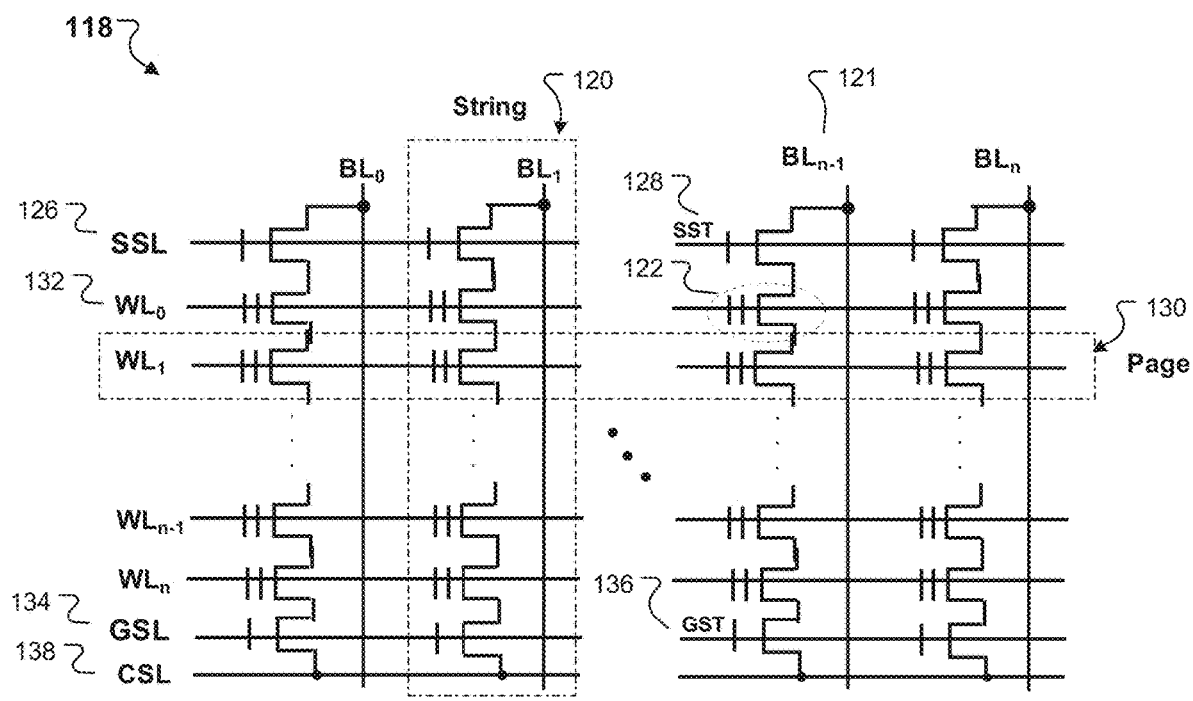
FIG. 1C illustrates an example block in a memory, according to one or more implementations.

FIG. 1C illustrates an example configuration of a block 118, e.g., a two-dimensional (2D) memory block, of the memory 116. The memory block 118 includes memory cells 122 that are coupled in series to column bit lines $BL_0$, $BL_1$, , $BL_{n-1}$, and $BL_n$ to form a number of cell strings 120, and to row word lines $WL_0$, $WL_1$, . . . , $WL_{n-1}$, and $WL_n$ to form a number of cell pages 130.

Each memory cell is coupled to a row decoder via a respective word line 132 and coupled to a column decoder via a respective bit line 121. Accordingly, each memory cell can be selected for operation through the respective word line 132 and the respective bit line 121. A control logic is connected to the row decoder and the column decoder, e.g., via global word lines and global bit lines, and configured to control the memory cells 122 through the row decoder and the column decoder. The control logic can be configured to receive commands and/or data signal from the device controller 112.

A cell string 120 can include a number of memory cells 122, a source select transistor (SST) 128, and a ground select transistor (GST) 136, which are all connected in series. A gate of the SST 128 is connected to a source select line (SSL) 126. Gates of the SSTs in different strings are also connected to the same SSL. Gates of the memory cells 122 are respectively connected to word lines $WL_0$, $WL_1$, . . . , $WL_{n-1}$, $WL_n$. The memory cells 122 are connected to a common source line (CSL) 138 via the GST 136. A gate of the GST 136 is connected to a ground select line (GSL) 134. Gates of the GSTs in different strings are also connected to the same GSL. The GST 136 and the SST 128 can be metal-oxide-semiconductor (MOS) transistors, and the memory cells 122 can be floating gate transistors.

A cell page 130 can include a number of memory cells 122. Gates of the memory cells 122 in the cell page 130 are coupled in series to a respective word line (WL). When an input voltage is applied to the word line, the input voltage is also applied to all the gates of the memory cells 122 in the cell page 130.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state can use the lowest voltage rage.

Figure 2A:
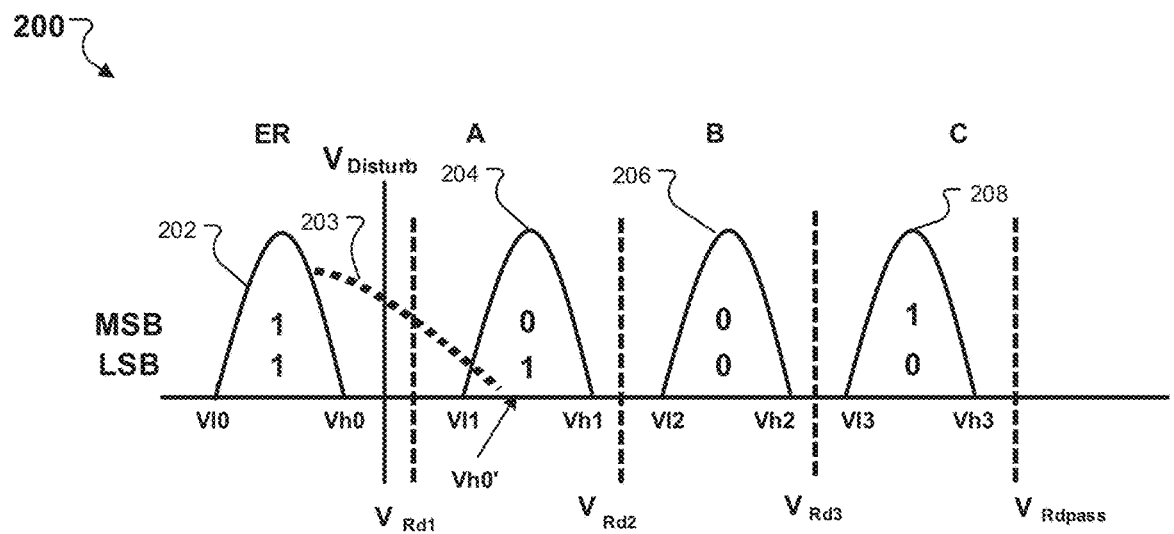
FIG. 2A illustrates an example of threshold voltage distributions of multi-level cell (MLC) memory cells for different states, according to one or more implementations.

FIG. 2A illustrates an example 200 of threshold voltage distributions and read voltages for different states of a memory cell of a memory, according to one or more implementations. The memory cell can be the memory cell 122 of FIG. 1C. The memory can be a NAND flash memory. For illustration purposes only, the memory cell is an MLC capable of storing two-bit data. The memory cell can be programmed or erased to have any one of four states ER, A, B, and C. In some examples, ER is an erased state (1, 1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between V10 and Vh0, the memory cell is in the state ER; if the memory cell has a threshold voltage between V11 and Vh1, the memory cell is in the state A; if the memory cell has a threshold voltage between V12 and Vh2, the memory cell is in the state B; and if the memory cell has a threshold voltage between V13 and Vh3, the memory cell is in the state C. Curves 202, 204, 206, 208 show threshold voltage distributions of the respective states ER, A, B, C of the memory cell, respectively.

During a read operation, a read voltage can be applied to a word line coupled to a gate of a selected memory cell to determine whether the selected memory cell is a turned-on or turned-off state. When a read voltage $V_{Rd1}$ that is larger than the threshold voltage of ER but smaller than the threshold voltage of A is applied, the memory cell is turned on when it has the state ER and turned off when it has the state A, B, or C; when a read voltage $V_{Rd2}$ that is larger than the threshold voltage of A but smaller than the threshold voltage of B is applied, the memory cell is turned on when it has the state ER or A and turned off when it has the state B or C; when a read voltage $V_{Rd3}$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage $V_{Rd}$, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

Due to repeated read operations, a read disturbance phenomenon may occur. In the read disturb phenomenon, a threshold voltage of the memory cell abnormally increases. As illustrated in FIG. 2A, in some cases, the distribution curve 202 for the erased state ER includes a dotted curve 203, which includes a higher threshold voltage. For example, the new higher limit voltage Vh0' is larger than the higher limit voltage Vh0. When the new higher limit voltage Vh0' is in the threshold voltage range V11 and Vh1 of the programmed state A, the erased state ER overlaps with the programmed state A. That is, the memory cell has overlapping states. When a read voltage $V_{Disturb}$ is applied, the memory cell having a threshold voltage in the erased state ER becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., ER and A, are more susceptible to read disturbance than states having higher threshold voltages, e.g., B and C.

Figure 2B:
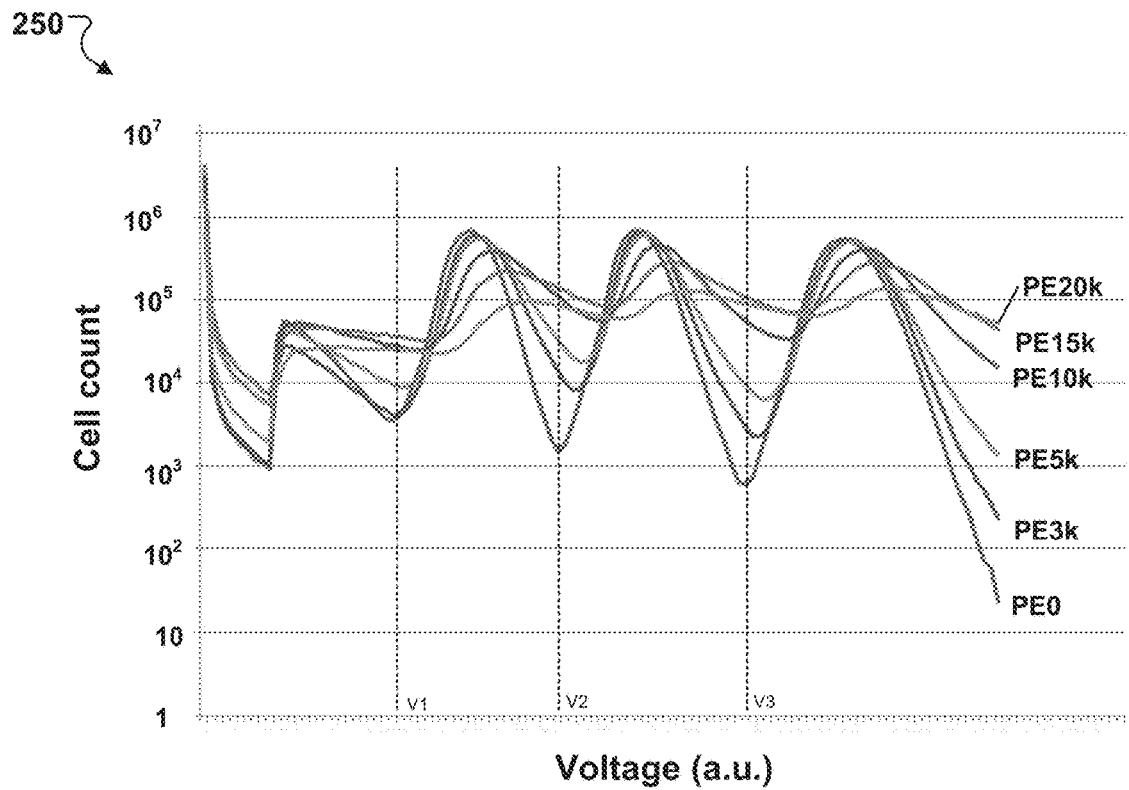
FIG. 2B illustrates an example of relationships between memory cell counts of a reading output and read voltages with different program/erase (P/E) cycle counts.

FIG. 2B illustrates an example 250 of profiles representing relationships between MLC cell counts and read voltages with different P/E cycles on a memory (0, 3,000 or 3k, 5,000 or 5k, 10,000 or 10k, 15,000 or 15k, 20,000 or 20k). FIG. 2B shows that threshold voltage distributions of memory cells and thus an optimal reading voltage can vary depending on one or more input parameters, e.g., P/E cycles, of the memory cells. A PE0 profile, when there is no P/E cycle, can correspond to a profile of threshold voltage distributions shown in FIG. 2A. A read voltage V1 corresponds to the read voltage $V_{Rd1}$ in FIG. 2A and can be an optimal read voltage to read the erased state ER (1, 1) of memory cells. A read voltage V2 corresponds to the read voltage $V_{Rd2}$ in FIG. 2A and can be an optimal read voltage to read the ER (1, 1) and the programmed state A (0, 1) of memory cells. A read voltage V3 corresponds to the read voltage $V_{Rd3}$ in FIG. 2A and can be an optimal read voltage to read the erased state ER (1, 1), the programmed state A (0, 1), and the programmed state B (0, 0) of memory cells, and the remaining memory cells can be determined to have the programmed state C (1, 0). With the increase of the number of P/E cycles on the memory, the optimal read voltages are increased and the profiles become shallower.

Figure 3:
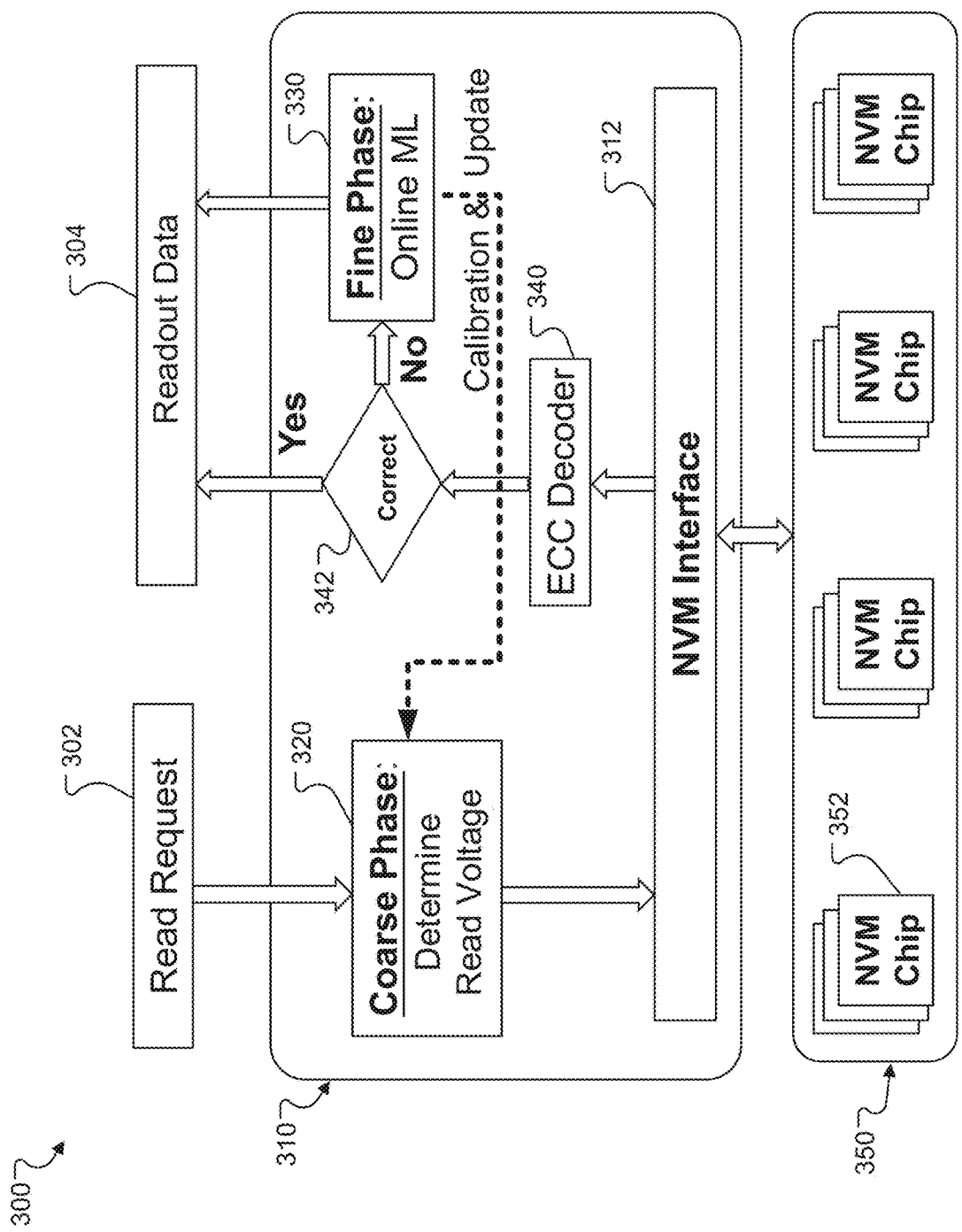
FIG. 3 illustrates an example of a memory system for determining read voltages using a coarse phase and a fine phase, according to one or more implementations.

FIG. 3 illustrates an example of a memory system 300 for determining read voltages with a coarse phase and a fine phase, according to one or more implementations. The memory system 300 can be the device 110 of FIG. 1A. The memory system 300 includes a memory controller 310, e.g., the device controller 112 of FIG. 1A, and a memory 350, e.g., the memory 116 of FIG. 1A or 1B. The memory 350 can be a non-volatile memory (NVM) device and can include a plurality of NVM chips 352. The memory controller 310 can include an NVM interface 312 configured to communicate with the memory 350. The NVM interface 312 can be an open NAND flash interface (ONFI) or a toggle interface.

In some implementations, the memory controller 310 includes an ECC decoder 340, e.g., the ECC decoder 144 of FIG. 1A. The ECC decoder 340 can be configured to decode memory data read from the memory 350 to detect and correct, up to an error correction capability of an ECC scheme, any bit errors that may be present in the memory data. The memory controller 310 can be configured to determine read voltages (e.g., optimal read voltages) for reading the memory data from the memory 350 in response to receiving a read request 302, e.g., from a host device such as the host device 120 of FIG. 1A. The read request 302 can include information associated with the memory data to be read from the memory 350, e.g., word line address or page address.

In some implementations, the memory controller 310 is configured to determine an optimal read voltage for reading the memory data using a coarse phase 320 and an optional fine phase 330. The memory controller 310 can include an engine, a module, or a circuit, e.g., the ML circuit 150 of FIG. 1A, to perform the coarse phase 320 and the fine phase 330, e.g., as discussed with further details in FIG. 4B.

In response to the read request, the memory controller 310, e.g., the ML circuit, can first determine a read voltage using stored read voltage data, e.g., the ML data 152 of FIG.1A, based on a first set of input parameters associated with the memory data. The first set of input parameters can include word line address, page address, a number of P/E cycles, a read temperature, a retention time, a read disturbance level, and/or any other suitable parameter. The read temperature represents a temperature of the memory when the memory data is read. The retention time represents a time period a memory cell in the memory data can be stored without distortion. The read disturbance level represents a level of read disturbance on the memory data.

Figure 4A:
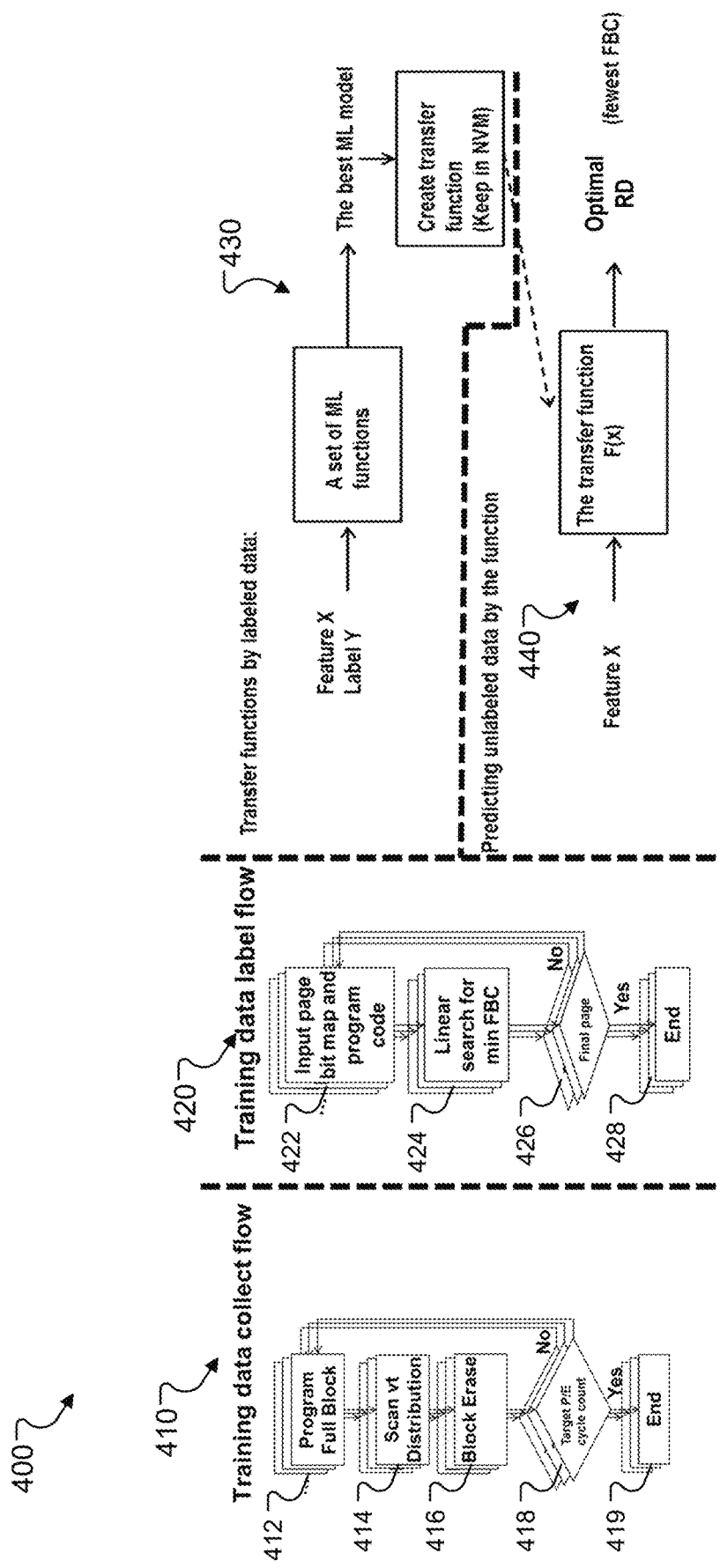
FIG. 4A illustrates an example process of supervised machine learning training for determining read voltages in a coarse phase, according to one or more implementations.

The stored read voltage data can be a transfer function determined based on supervised ML offline training, e.g., as discussed with further detailed in FIG. 4A. The stored read voltage data represents relationships between a plurality of inputs associated with a number of input parameters and optimal read voltages. The stored read voltage data can be stored in the memory 350, and the memory controller 310, e.g., the ML circuit, can communicate with the memory 350 via the NVM interface 312, and can search and identify information related to the first set of input parameters and determine the read voltage based on the information and the first set of input parameters.

The memory controller 310 can use the read voltage determined in the coarse phase 320 as a reference read voltage to read the memory data from the memory 350, and then the ECC decoder 340 can decode the memory data read from the memory 350 to detect failed bits present in the memory data. The memory controller 310, e.g., the ML circuit, can determine whether the failed bits can be corrected by the ECC decoder 340 in a checking step 342. If the failed bits can be corrected, the reading output of the memory data can be output as readout data 304, e.g., to the host device.

If the failed bits fail to be corrected, the memory controller 310, e.g., the ML circuit, can perform online machine learning in a fine phase 330. The memory controller 310 can collect a second set of input parameters associated with the memory data. The second set of input parameters can include the first set of input parameters and one or more additional parameters. For example, the second set of input parameters can a fail bit count in the reading output of the memory data detected by the ECC decoder 340, a syndrome of LDPC code, a number of iteration of LDPC code, a number of "1" bit values on each of previous read voltages using for the memory data, previous ECC decoding results, or any other suitable parameters. The memory controller 310 can use one or more ML algorithms to determine a second read voltage based on the second set of input parameters. The ML algorithms can include linear regression, support vector regression, CNN, RNN, or other suitable algorithms. The memory controller 310 can use the second read voltage to read the memory data from the memory 350 and output a second reading output of the memory data as the readout data 304. The memory controller 310, e.g., the ML circuit, can also provide a result of the fine phase 330, e.g., the second read voltage, to calibrate and update the stored read voltage data used in the coarse phase 320.

FIG. 4A illustrates an example process 400 of supervised machine learning (ML) training for determining read voltages in a coarse phase, according to one or more implementations. The supervised ML training can be performed, e.g., by a computing system, during manufacturing a memory system. The memory system can be the device 110 of FIG. 1A or the memory system 300 of FIG. 3. The memory system can include a memory, e.g., the memory 116 of FIG. 1A or 1B, or the memory 350 of FIG. 3, and a memory controller, e.g., the device controller 112 of FIG. 1A or the memory controller 310 of FIG. 3. The memory can include a plurality of blocks, e.g., the block 118 of FIG. 1B or 1C, and each block can include a plurality of pages, e.g., the page 130 of FIG. 1C. The supervised ML training is executed after the memory is manufactured.

First, training data for the supervised ML training is collected in a training data collection flow 410 for the plurality of blocks. The flow 410 can repeat steps 412, 414, 416, and 418 to obtain training data under different P/E cycles. For each block, at 412, the full block is first programmed with data that can be predetermined program codes. Then, at 414, threshold voltage (vt) distributions of states of the programmed data in the block are scanned to obtain corresponding page bit maps, e.g., the profile PE0, PE3k, PE5k, PE10k, PE15k, or PE20k. At 416, the block is erased. At 418, it is determined whether the number of P/E cycles on the block reaches a target P/E cycle count. If the number of P/E cycles on the block reaches the target P/E cycle count, the flow 410 ends at 419. If the number of P/E cycles on the block does not reach the target P/E cycle count, the flow 410 goes back to step 412 to continue programming and erasing the block.

The process 400 includes a training data label flow 420 for a block. At 422, for each page in the block, a page bit map obtained at step 414 and a corresponding program code used at step 412 is input. Then a read voltage is used to read the page and a reading output of the page is checked with respect to the corresponding program code to determine a failed bit count (FBC). The read voltage is linearly increased to find an optimal read voltage with a minimum (or fewest) FBC at step 424. Then, it is determined whether the page is a final page in the block at 426. If the page is the final page, the flow 420 ends at 428. If the page is not the final page, the flow 420 returns to step 422 to perform the steps on a next page in the block.

The collected training data can include a plurality of inputs and corresponding optimal read voltage as outputs. Each optimal read voltage corresponds to a respective input. The input can include respective values of a number of parameters. The parameters can include word line address or page address, a P/E cycle count, temperature, retention time, a read disturbance level, or any other suitable parameter. The computing system can check or determine characteristics of memory cells in the memory, and determine respective influence levels for each of the parameters based on the characteristics. The influence level can associated with an influence on a performance of the memory cells, e.g., a number of failed bits. For a parameter with a higher influence level, the computing system can collect the training data with a smaller interval in the flow 410. For a parameter with a lower influence level, the computing system can collect the training data with a larger interval in the flow 410. In one example, if the temperature has a higher influence level, the temperature interval for the flow 410 can be 1 degree; if the temperature has a lower influence level, the temperature interval for the flow 410 can be 5 degree. As another example, if the P/E cycle count has a higher influence level, the P/E cycle interval for the flow 410 can be 1,000 (or 1k); if the P/E cycle has a lower influence level, the P/E cycle interval for the flow 410 can be 5,000 (or 5k). As a further example, if the page address has a higher influence level, the page interval for the flow 410 can be 1; if the page address has a lower influence level the page interval for the flow can be 5 or 10. In such a way, the collection time of the training data and the volume of the training data can be both reduced.

The computing system can then perform machine learning training using the collected training data at 430. Feature X represents the inputs and label Y represents the optimal read voltages. The computing system can use a set of ML functions or algorithms to get a best ML model which can be used to create a transfer function F(x). The transfer function can include a lookup table having a size smaller than a normal lookup table, e.g., due to the grouping-based training data collection. The transfer function can also include a hash function, k mean, or any other suitable form. The transfer function can be stored in the memory.

The transfer function can be used in a coarse phase, e.g., the coarse phase 320 of FIG. 3, performed by the memory controller. At 440, the memory controller can use the transfer function stored in the memory to predict (or determine) an optimal read voltage (RD) for unlabeled data, e.g., feature X including values of a number of parameters associated with data to be read from the memory. The optimal read voltage corresponds to the fewest failed bit count (FBC) in a reading output of the data.

Figure 4B:
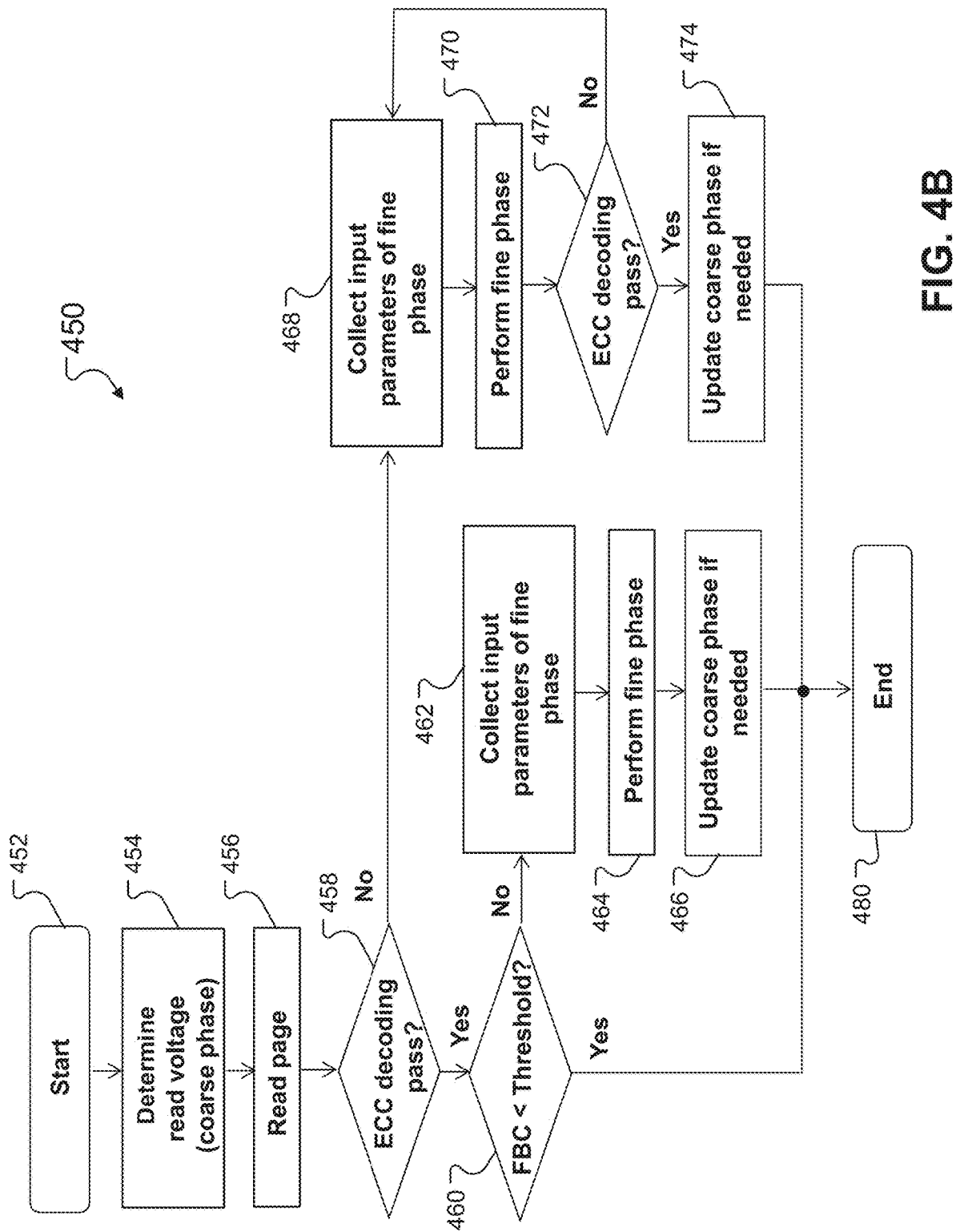
FIG. 4B illustrates an example of a process for determining read voltages for memory systems with a coarse phase and a fine phase, according to one or more implementations.

FIG. 4B illustrates an example of a process 450 for determining read voltages for memory systems with coarse phase and fine phase machine learning, according to one or more implementations. The memory system can be the device 110 of FIG. 1A or the memory system 300 of FIG. 3. The memory system can include a memory, e.g., the memory 116 of FIG. 1A or 1B, or the memory 350 of FIG. 3, and a memory controller, e.g., the device controller 112 of FIG. 1A or the memory controller 310 of FIG. 3. The memory controller can include an ECC decoder, e.g., the decoder 144 of FIG. 1A or the ECC decoder 340 of FIG. 3. The memory controller can also include an ML circuit, e.g., the ML circuit 150 of FIG. 1A, to perform coarse phase and fine phase machine learning for determining read voltages for the memory system. The memory can include a plurality of blocks, e.g., the block 118 of FIG. 1B or 1C, and each block can include a plurality of pages, e.g., the page 130 of FIG. 1C. The process 450 can be performed by the memory controller.

At 452, the process 450 starts. The process 450 can start in response to receiving a read request, e.g., from a host device such as the host device 120 of FIG. 1A. The read request can indicate to read memory data from the memory. The memory data can be stored in a specified address, e.g., a specified page in a specified block, in the memory.

At 454, a first read voltage is determined in a coarse phase by the memory controller, e.g., by the ML circuit. The coarse phase can be the coarse phase 320 of FIG. 3 or 440 of FIG. 4A. The memory controller can collect a first set of parameters associated with the memory data to be read from the memory. The first set of parameters can include at least one of address information such as page address or word line address, a number of P/E cycles (or P/E cycle count), a reading temperature, a read disturbance level, or a retention time. The memory controller can determine the first read voltage using stored read voltage data, e.g., the ML data 152 of FIG. 1A, based on the first set of parameters.

The stored read voltage data can be stored in the memory. As illustrated in FIG. 4A, the stored read voltage data can be generated based on supervised ML training using a plurality of inputs associated with the memory and corresponding optimal read voltages. Each of the optimal read voltages corresponds to a minimum failed bit count of a reading output for a respective page in the memory with a respective input of the inputs. Each of the inputs can include respective values of a plurality of parameters. The plurality of parameters can include the first set of parameters. Each of the plurality of parameters can have a respective influence level on a memory cell characteristic of the memory, and value intervals of the plurality of parameters in the inputs can be determined based on the respective influence levels of the plurality of parameters. As noted above, the supervised ML training can be performed offline during manufacturing the memory system and after the memory is fabricated.

In some examples, the stored read voltage data includes a transfer function generated based on the supervised ML training, and the transfer function represents a relationship between an input of the plurality of parameters and an optimal read voltage. The transfer function can include a lookup table, a hash function, or a k mean.

At 456, the first read voltage determined at step 454 is used to read a corresponding page storing the memory data in a read operation performed by the memory controller. The ECC decoder then decodes a first reading output of the memory data using the first read voltage. At 458, the memory controller determines whether the first reading output passes an ECC test, e.g., by determining whether a failed bit count (FBC) of the first reading output is beyond a first predetermined threshold. For example, the ECC decoder has a capability of correcting 300 error bits. The first predetermined threshold can be substantially identical to 300.

If the memory controller determines that the FBC of the first reading output is no more than the first predetermined threshold, at 460, the memory controller can further determine whether the FBC of the first reading output is less than a second predetermined threshold, e.g., 250, that is smaller than the first predetermined threshold, e.g., 300. If the FBC is less than the second predetermined threshold, the process 450 ends at 480, and the memory controller can output the first reading output as a target reading output of the memory data, e.g., to the host device. In some cases, in response to determining that the FBC is no more than the first predetermined threshold, the memory controller can directly output the first reading output of the memory data.

If the memory controller determines that the FBC is no more than the first predetermined threshold and no less than the second predetermined threshold, e.g., between 250 and 300, at 462, the memory controller collects a second set of parameters associated with the memory data for fine phase processing. The second set of parameters can include the first set of parameters. In some cases, the second set of parameters can include at least one or more additional parameters, e.g., a failed bit count in the first reading output, a number of "1" values obtained for each of previous read voltages, a number change of "1" values between a previous read voltage and a current read voltage, a read time, a syndrome of low-density parity-check (LDPC) code, or a number of iteration of LDPC code.

At 464, the fine phase is performed by the memory controller, e.g., by the ML circuit. The fine phase can be the fine phase 330 of FIG. 3. In the fine phase, the memory controller can generate a second read voltage using at least one ML algorithm based on the second set of parameters. The at least one ML algorithm can include at least one of a linear regression, a support vector regression, or a deep learning algorithm including a convolutional neural network (CNN) algorithm or a Recurrent Neural Network (RNN) algorithm. The memory controller can then use the second read voltage to read the memory data and output the second reading output of the memory data. As the first reading output passes the ECC test at 458, there is no need to determine whether the second reading output passes the ECC test because the second reading output is assumed to have a smaller FBC by using a better optimal read voltage than the first reading output.

In some implementations, the memory controller updates the coarse phase if needed at 466 using a result of the fine phase. The second read voltage and associated information can be provided to calibrate and update the stored read voltage data, e.g., the transfer function, used in the coarse phase. The updated stored read voltage data can be used in a next process.

There can be multiple reasons that the FBC of the first reading output is no less than the second predetermined threshold at 460. If the ECC decoding with a bad read voltage which leads to more error bits under a good enough threshold voltage (Vt) distribution, the update is needed at step 466. For example, in response to determining threshold voltages of states of memory cells in the memory data are within corresponding predetermined ranges, the memory controller performs the update at step 466. If the ECC decoding with a good enough read voltage under an overlapping or noisy Vt distribution, the update is not needed. Instead, an alert signal indicating an increase of ECC performance or reliability can be generated. For example, the memory controller is configured not to update the stored read voltage data with the second read voltage in response to determining that at least one threshold voltage of a state of memory cells in the memory data is outside of a corresponding predetermined range.

If the memory controller determines that the first reading output fails to pass the ECC test, e.g., by determining that the FBC of the first reading output is beyond the first predetermined threshold, at 468, the memory controller collects a third set of parameters associated with the memory data for the final phase processing. The third set of parameters can be similar to the second set of parameters collected at 462. The third set of parameters can include the first set of parameters. In some cases, the third set of parameters can include at least one or more additional parameters, e.g., a failed bit count in the first reading output, a number of "1" values obtained for each of previous read voltages, a number change of "1" values between a previous read voltage and a current read voltage, a read time, a syndrome of low-density parity-check (LDPC) code, or a number of iteration of LDPC code.

Then, at 470, the fine phase is performed by the memory controller, e.g., by the ML circuit. Step 470 can be similar to step 464. In the fine phase, the memory controller can generate a third read voltage using the ML algorithm based on the third set of parameters. The memory controller can then use the third read voltage to read the memory data to obtain a third reading output of the memory data. As the first reading output fails to pass the ECC test at 458, the memory controller can determine whether the third reading output passes the ECC test at 472. If the third reading output fails to pass the ECC test, the process 450 returns to step 468, and the memory controller can adjust the third set of parameters, e.g., by adding one or more new parameters into the third set of parameters, and generate a new third read voltage based on the adjusted third set of parameters. If the third reading output passes the ECC test, the memory controller outputs the third reading output of the memory data.

Similar to step 466, the memory controller can determine whether to update the coarse phase using the result of the fine phase if needed at 474. As noted above, there can be multiple reasons that the first reading output fails the ECC test at 458. In some cases, in response to determining threshold voltages of states of memory cells in the memory data are within corresponding predetermined ranges, the memory controller performs the update at step 474. In some cases, the memory controller determines not to update the stored read voltage data with the second read voltage in response to determining that at least one threshold voltage of a state of memory cells in the memory data is outside of a corresponding predetermined range.

Figure 5:
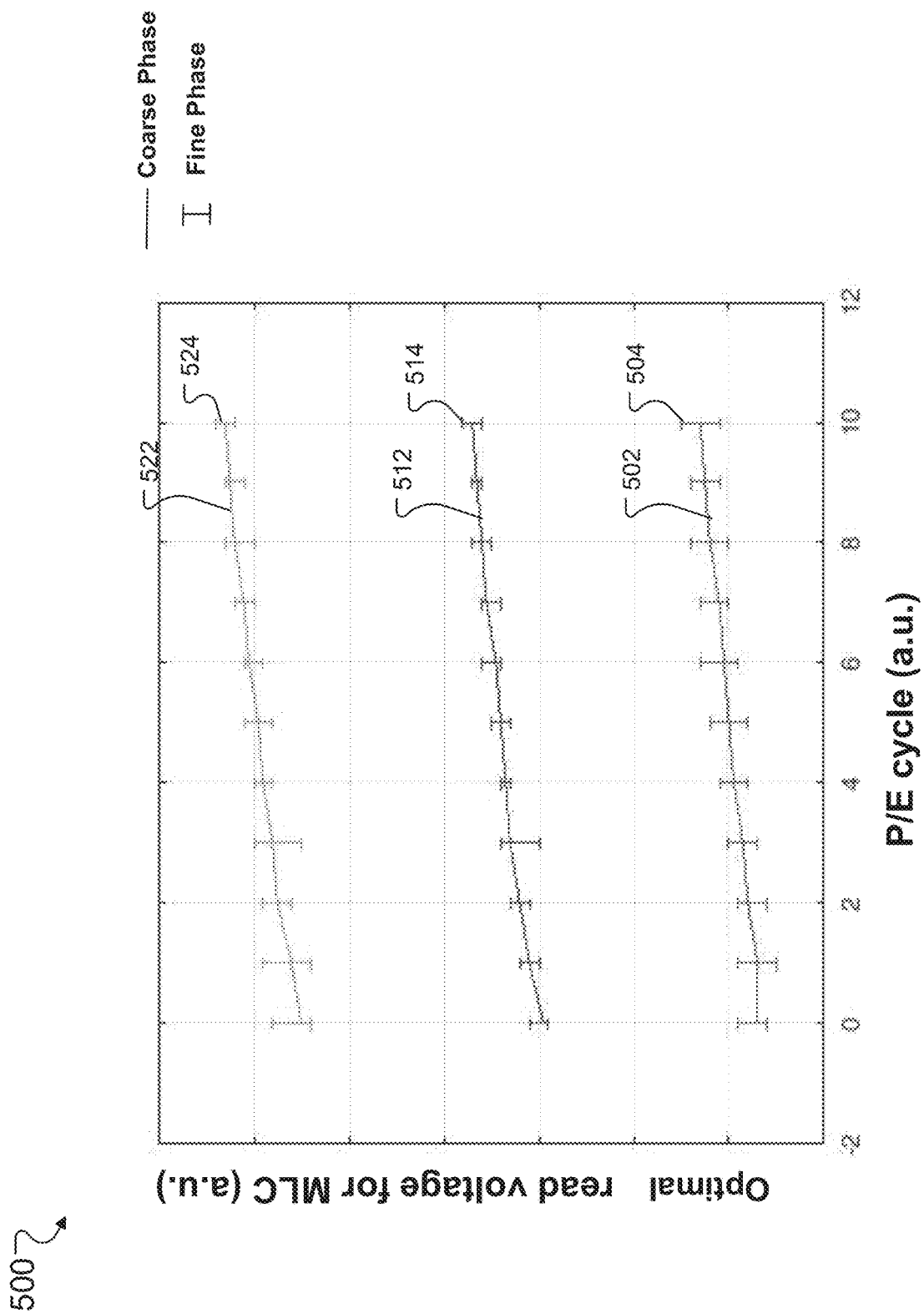
FIG. 5 illustrates an example of a relationship between optimal read voltages for MLC memory cells and P/E cycle counts with a coarse phase and a fine phase, according to one or more implementations.

FIG. 5 illustrates an example 500 of a relationship between optimal read voltages for MLC memory cells and P/E cycle counts using coarse phase and fine phase for a memory system, according to one or more implementations. As discussed above, for memory data programmed with MLC, there can be three optimal read voltages, e.g., $V_{Rd1}$, $V_{Rd2}$, $V_{Rd3}$ of FIG. 2A. Plots 502, 512, and 522 show the optimal read voltages obtained using the coarse phase, e.g., the coarse phase 320 of FIG. 3 or step 454 of FIG. 4B, with respect to different P/E cycle counts. Variations 504, 514, and 524 show the variations of the optimal read voltages obtained using the fine phase, e.g., the fine phase 330 of FIG. 3 or step 464 or step 470 of FIG. 4B. The example 500 shows that with an increasing P/E cycle count, the optimal read voltage increases. The optimal read voltages determined by the coarse phase can show a shift trend of the optimal read voltages. The optimal read voltages determined by the fine phase can show variations of the optimal read voltages, which can be used to calibrate or update the optimal read voltages obtained by the coarse phase. Thus, a combination of the coarse phase and the fine phase can increase read accuracy with reduced computation and time overload to therefore improve the performance of the memory system.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system comprising:
  a memory; and
  a memory controller coupled to the memory and configured to:
    obtain a first reading output of target memory data in the memory by using a first read voltage corresponding to a first set of parameters associated with the target memory data;
    in response to determining that the first reading output fails to pass an Error-Correcting Code (ECC) test, obtain a second reading output of the target memory data by using a second read voltage corresponding to a second set of parameters associated with the target memory data, the second read voltage being generated using at least one machine learning (ML) algorithm based on the second set of parameters, the second set of parameters comprising the first set of parameters; and
    in response to determining that the second reading output passes the ECC test, output the second reading output as a target reading output of the target memory data.

2. The memory system of claim 1, wherein the memory controller is configured to generate the first read voltage using stored read voltage data based on the first set of parameters.

3. The memory system of claim 2, wherein the stored read voltage data is generated based on supervised ML training using a plurality of inputs associated with the memory and corresponding optimal read voltages, each of the optimal read voltages corresponding to a minimum failed bit count of a reading output for a respective page in the memory with a respective input of the inputs, each of the inputs comprising respective values of a plurality of parameters, the plurality of parameters comprising the first set of parameters.

4. The memory system of claim 3, wherein each of the plurality of parameters has a respective influence level on a memory cell characteristic of the memory, and value intervals of the plurality of parameters in the inputs are determined based on the respective influence levels of the plurality of parameters.

5. The memory system of claim 3, wherein the stored read voltage data comprises a transfer function generated based on the supervised ML training, the transfer function representing a relationship between an input of the plurality of parameters and an optimal read voltage.

6. The memory system of claim 2, wherein the memory controller is configured to update the stored read voltage data with the second read voltage in response to determining that the second reading output passes the ECC test.

7. The memory system of claim 6, wherein the memory controller is configured to:
  update the stored read voltage data in response to determining that threshold voltages of states of memory cells in the target memory data are within corresponding predetermined ranges.

8. The memory system of claim 1, wherein the memory controller is configured to:
  in response to determining that the second reading output fails to pass the ECC test, adjust the second set of parameters and generate a new second read voltage using the at least one ML algorithm based on the adjusted second set of parameters.

9. The memory system of claim 1, wherein the memory controller is configured to:
  determine whether the first reading output passes the ECC test by determining whether a failed bit count (FBC) of the first reading output is beyond a first predetermined threshold.

10. The memory system of claim 9, wherein the memory controller is configured to:
  in response to determining that the failed bit count of the first reading output is no more than the first predetermined threshold, determine whether the failed bit count of the first reading output is beyond a second predetermined threshold that is smaller than the first predetermined threshold.

11. The memory system of claim 10, wherein the memory controller is configured to:
  in response to determining that the failed bit count of the first reading output is no more than the second predetermined threshold, output the first reading output as the target reading output of the target memory data.

12. The memory system of claim 10, wherein the memory controller is configured to:
in response to determining that the failed bit count of the first reading output is beyond the second predetermined threshold and no more than the first predetermined threshold, generate a third read voltage using the at least one ML algorithm.

13. The memory system of claim 12, wherein the memory controller is configured to:
update the stored read voltage data with the third read voltage.

14. The memory system of claim 1, wherein the first set of parameters comprises at least one of address information, a number of P/E cycles, a reading temperature, a read disturbance level, or a retention time.

15. The memory system of claim 1, wherein the second set of parameters comprises at least one of a failed bit count in the first reading output, a number of "1" values obtained for each read voltage, a number change of "1" values between a previous read voltage and a current read voltage, a read time, a syndrome of low-density parity-check (LDPC) code, or a number of iteration of LDPC code.

16. The memory system of claim 1, wherein the at least one ML algorithm comprises at least one of a linear regression, a support vector regression, or a deep learning algorithm including a convolutional neural network (CNN) algorithm or a Recurrent Neural Network (RNN) algorithm.

17. A memory system comprising:
a memory; and
a memory controller coupled to the memory and configured to:
determine a first read voltage using stored read voltage data based on a first set of parameters associated with memory data to be read from the memory;
obtain a first reading output by reading the memory data using the first read voltage;
determine whether the first reading output passes an Error Correction Code (ECC) test;
in response to determining that the first reading output fails to pass the ECC test, generate a second read voltage using at least one machine learning (ML) algorithm based on a second set of parameters associated with the memory data, the second set of parameters comprising the first set of parameters and at least one additional parameter;
obtain a second reading output by reading the memory data using the second read voltage;
determine whether the second reading output passes the ECC test; and
in response to determining that the second reading output passes the ECC test, output the second reading output as the memory data read from the memory.

18. The memory system of claim 17, wherein the memory controller is configured to:
in response to determining that the second reading output passes the ECC test, update the stored read voltage data with the second read voltage.

19. A memory controller coupled to a memory, the memory controller comprising:
at least one processor;
an Error Correction Code (ECC) circuit;
a machine learning (ML) circuit; and
at least non-transitory medium storing instructions executable by the processor,
wherein the memory controller is configured to:
determine, by the ML circuit, a first read voltage using stored read voltage data based on a first set of parameters associated with memory data to be read from the memory;
obtain, by the processor, a first reading output by reading the memory data using the first read voltage;
determine, by the ECC circuit, whether the first reading output passes an ECC test;
in response to determining that the first reading output does not pass the ECC test, generate, by the ML circuit, a second read voltage using at least one machine learning (ML) algorithm based on a second set of parameters associated with the memory data, the second set of parameters comprising the first set of parameters and at least one additional parameter;
obtain, by the processor, a second reading output by reading the memory data using the second read voltage;
determine, by the ECC circuit, whether the second reading output passes the ECC test; and
in response to determining that the second reading output passes the ECC test, output, by the processor, the second reading output as the memory data read from the memory.

20. The memory controller of claim 19, wherein the stored read voltage data is stored in the memory, and
wherein the memory controller comprises a memory interface, and the ML circuit is configured to communicate with the memory through the memory interface.

* * * * *